(12) United States Patent
Kim

(10) Patent No.: US 7,227,381 B2
(45) Date of Patent: Jun. 5, 2007

(54) INPUT BUFFER AND SEMICONDUCTOR DEVICE INCLUDING THE SAME

(75) Inventor: Jin-Hyun Kim, Yongin-Si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 166 days.

(21) Appl. No.: 10/987,660

(22) Filed: Nov. 12, 2004

(65) Prior Publication Data

US 2005/0134313 A1    Jun. 23, 2005

(30) Foreign Application Priority Data

Dec. 20, 2003    (KR) .................... 10-2003-0094264

(51) Int. Cl.
*H03K 19/0175*    (2006.01)
(52) U.S. Cl. .......................... 326/86; 326/68
(58) Field of Classification Search .................. 326/62, 326/68, 82, 83, 86, 87; 327/108, 109, 333
See application file for complete search history.

(56) References Cited

U.S. PATENT DOCUMENTS

| | | | | |
|---|---|---|---|---|
| 5,448,528 A | | 9/1995 | Nagai ..................... 365/233 |
| 5,804,985 A | * | 9/1998 | Shieh et al. .................. 326/39 |
| 6,005,414 A | * | 12/1999 | Reay ............................ 326/83 |
| 6,222,388 B1 | * | 4/2001 | Bridgewater, Jr. ........... 326/86 |
| 6,654,272 B2 | | 11/2003 | Santin et al. ................ 365/96 |
| 6,820,149 B2 | * | 11/2004 | Moy ......................... 710/104 |
| 2003/0021176 A1 | | 1/2003 | Hogan | |

FOREIGN PATENT DOCUMENTS

| | | |
|---|---|---|
| JP | 5174571 | 7/1993 |
| JP | 7161185 | 6/1995 |
| JP | 2003091992 | 3/2003 |

* cited by examiner

*Primary Examiner*—James H. Cho
(74) *Attorney, Agent, or Firm*—Monica H. Choi

(57) ABSTRACT

An input buffer includes a control circuit that generates first control signals depending on a signal type of at least one input signal. The input buffer also includes a receiver that generates at least one output signal of a predetermined signal type from the at least one input signal and the first control signals. Thus, for a semiconductor device using a plurality of such input buffers, interface circuits of application circuits communicating with the semiconductor device are eliminated, thereby minimizing power consumption and layout area.

18 Claims, 7 Drawing Sheets

INPUT BUFFER AND SEMICONDUCTOR DEVICE INCLUDING THE SAME

BACKGROUND OF THE INVENTION

This application claims priority to Korean Patent Application No. 2003-0094264, filed on Dec. 20, 2003, in the Korean Intellectual Property Office, the disclosure of which is incorporated herein in its entirety by reference.

1. Field of the Invention

The present invention relates generally to input buffers, more particularly, to an input buffer generating an output signal of a predetermined signal type regardless of the signal type of at least one input signal.

2. Description of the Related Art

FIG. 1 shows a system 100 including a conventional multi-port/multi-media semiconductor device 150 and a circuit block 110. The circuit block 110 includes a plurality of application circuits such as an audio input circuit 111, a video input circuit 115, a digital media processing circuit 119, an audio output circuit 127, and a video output circuit 131. Such circuits 111, 115, 119, 127, and 121 may be implemented as separate semiconductor chips.

The audio input circuit 111, the video input circuit 115, the digital media processing circuit 119, the audio output circuit 127, the video output circuit 131, and the multi-port/multi-media semiconductor device 150 each use unique signal levels to exchange data with external devices. A signal level characterizes a signal type defined by a direct current (DC) reference level and a swing width about the DC reference level (hereinafter referred to as "a reference level and a swing width").

Examples of conventional signal types include a transistor-transistor logic (TTL) level, a complementary metal oxide semiconductor device (CMOS) level, a stub series transceiver logic (SSTL) level, a Rambus signal logic (RSL) level, and a differential Rambus signaling (DRSL) level. As interfacing speed increases, the swing width is reduced.

To input and output data at high speed, the audio input circuit 111, the video input circuit 115, the digital media processing circuit 119, the audio output circuit 127, the video output circuit 131, and the multi-port/multi-media semiconductor device 150 include input/output (I/O) interfaces 113, 117, 121, 123, and 125, respectively. Each of the I/O interfaces 113, 117, 121, 123, and 125 converts a signal level of an input signal to a signal level processed by the corresponding application circuit. Each of the I/O interfaces 113, 117, 121, 123, and 125 may be implemented as separate chips.

For example, assume that a signal level (or a signal system) of a signal output from the video input circuit 115 (processing a video signal Vin) is different from that used in the semiconductor device 150. In that case, the I/O interface 117 which is a transmitting circuit of the video input circuit 115 converts the signal level and the amplitude of the signal from the video input circuit. The converted signal is transmitted to the semiconductor device 150 via a channel. Then, an input buffer 151 of the semiconductor device 150 converts the signal level and amplitude of the signal input via the channel into those processed by the semiconductor device 150.

Similarly, the I/O interface 113 of the audio input circuit 111 (processing an audio signal Ain) converts the level and the amplitude of a signal from the audio input circuit 111. The I/O interface 113 of the audio input circuit 111 transmits such a converted signal to the input buffer 151 of the semiconductor device 150.

The digital media processing circuit 119 exchanges signals with the semiconductor device 150 via the I/O interfaces 121, 123, and 125, which are transmitting/receiving circuits. Each of the I/O interfaces 121, 123, and 125 converts the level and the amplitude of input and output signals.

The audio output circuit 127 and the video output circuit 131 process signals from an output buffer 157 of the semiconductor device 150. The audio output circuit 127 and the video output circuit 131 also output an audio output signal Aout and a video output signal Vout, respectively.

In this manner in the prior art, the application circuits 111, 115, 119, 127, and 131 and the semiconductor device 150 using different signal levels require additional chips, 113, 117, 121, 123, 125, 151, 153, 155, and 157 for interfacing with each-other to exchange signals at high speed. As the number of application circuits exchanging signals with the multi-port/multi-media semiconductor device 150 increases, the number of interfacing chips converting different signal levels also increases, resulting in an increase in the cost of the entire system.

Thus, a mechanism is desired for decreasing the number of interfacing chips during signal exchange between application circuits and the semiconductor device 150.

SUMMARY OF THE INVENTION

Accordingly, an input buffer of the present invention generates an output signal of a predetermined signal type (such as of the CMOS swing type) regardless of the signal type of an input signal.

In an aspect of the present invention, such an input buffer includes a control circuit that generates first control signals depending on a signal type of at least one input signal. In one example embodiment of the present invention, the signal type of the at least one input signal indicates a reference level and a swing width of the at least one input signal. The input buffer also includes a receiver that generates at least one output signal of a predetermined signal type from the at least one input signal and the first control signals.

In another aspect of the present invention, the input buffer also includes a program circuit for generating second control signals indicating the signal type of the at least one input signal. In that case, the control circuit receives the second control signals to generate the first control signals from the second control signals.

In one example embodiment of the present invention, the program circuit includes a plurality of fuses. Each fuse is cut or not cut when programming the signal type of the at least one input signal into the program circuit.

In another embodiment of the present invention, the program circuit includes at least one register for generating and storing the second control signals from a MRS (mode register set) signal when programming the signal type of the at least one input signal into the program circuit.

In yet another embodiment of the present invention, the receiver includes a plurality of current sources. Each of the current sources is turned on or off depending on the first controls signals, for generating the output signal of the predetermined signal type.

In one example embodiment of the present invention, the predetermined signal type of the output signal is of a CMOS swing type.

In a further embodiment of the present invention, the control circuit includes a bias voltage generator that generates bias voltages and a driver that generates the first control signals from the bias voltages and the second control signals generated by the program circuit.

In another embodiment of the present invention, an input buffer includes a control circuit that generates control signals indicating a first common voltage of input signals. In addition, the input buffer includes a receiver for generating an output signal of a second common voltage from the input signals and the control signals.

In one example embodiment of the present invention, the receiver includes a differential amplifier that generates the output signal from the input signals and the control signals. The receiver also includes a first group of current sources coupled between a first voltage source and a first terminal of the differential amplifier. Each of the first group of current sources is turned off or on to source current to the first terminal, depending on the control signals. Additionally, the receiver includes a second group of current sources coupled between a second voltage source and a second terminal of the different amplifier. Each of the second group of current sources is turned off or on to sink current from the second terminal, depending on the control signals.

In this manner, the input buffer generates an output signal of a predetermined signal type (such as the CMOS swing type) regardless of the signal type of the input signals. Thus, for a semiconductor device using a plurality of such input buffers, interface circuits of application circuits communicating with the semiconductor device are eliminated, thereby minimizing power consumption and layout area.

BRIEF DESCRIPTION OF THE DRAWINGS

The above and other features and advantages of the present invention will become more apparent when described in detailed exemplary embodiments thereof with reference to the attached drawings in which.

The figures referred to herein are drawn for clarity of illustration and are not necessarily drawn to scale. Elements having the same reference number in FIGS. 1, 2, 3, 4, 5, 6, 7, and 8 refer to elements having similar structure and/or function.

DETAILED DESCRIPTION OF THE INVENTION

Figure 2:
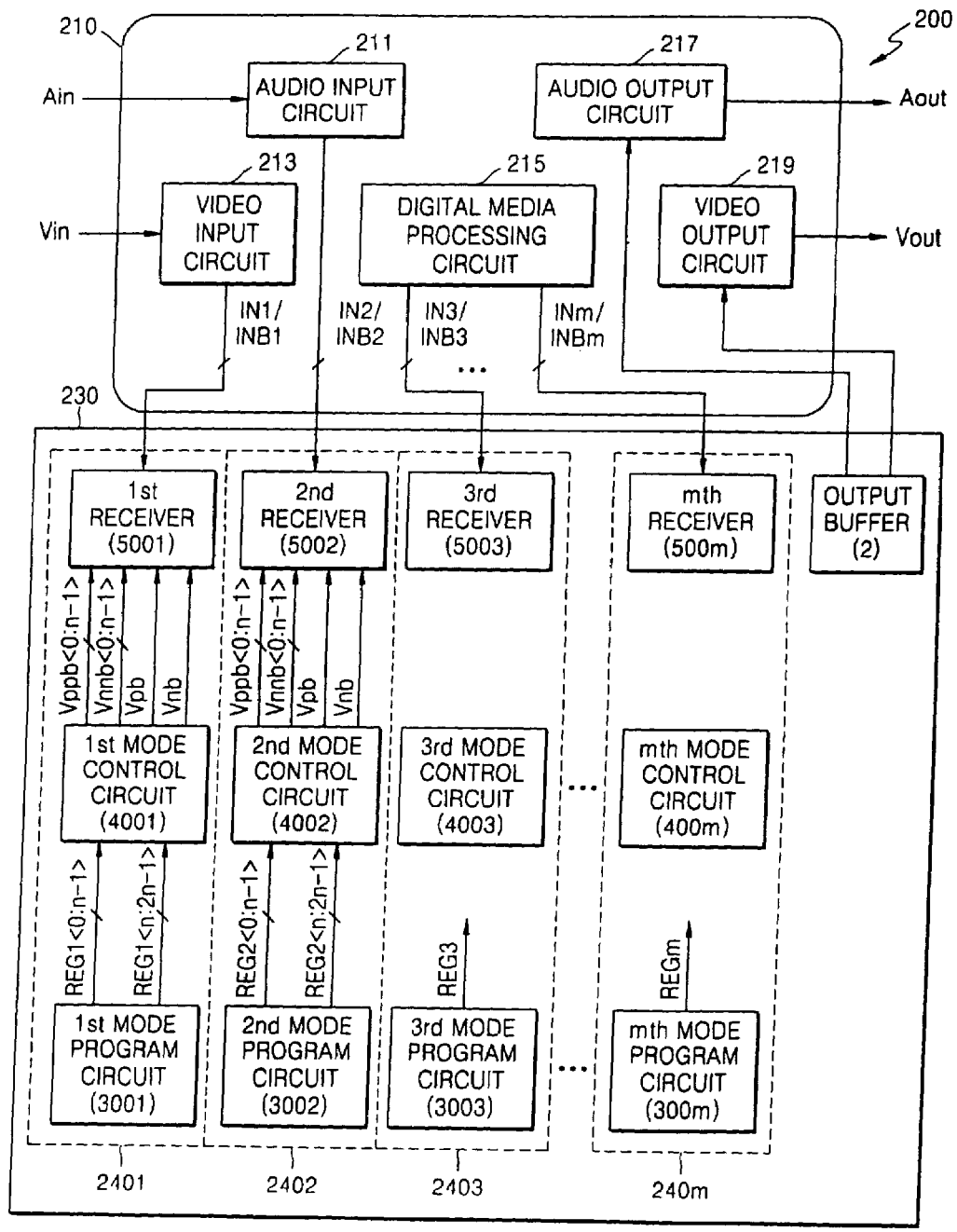
FIG. 2 illustrates a system including a multi-port/multi-media semiconductor device according to an embodiment of the present invention.

FIG. 2 shows a system 200 including a multi-port/multi-media semiconductor device 230 according to an embodiment of the present invention. Referring to FIG. 2, the system 200 includes a circuit block 210 with application circuits that interface with the multi-port/multi-media semiconductor device 230.

Figure 1:
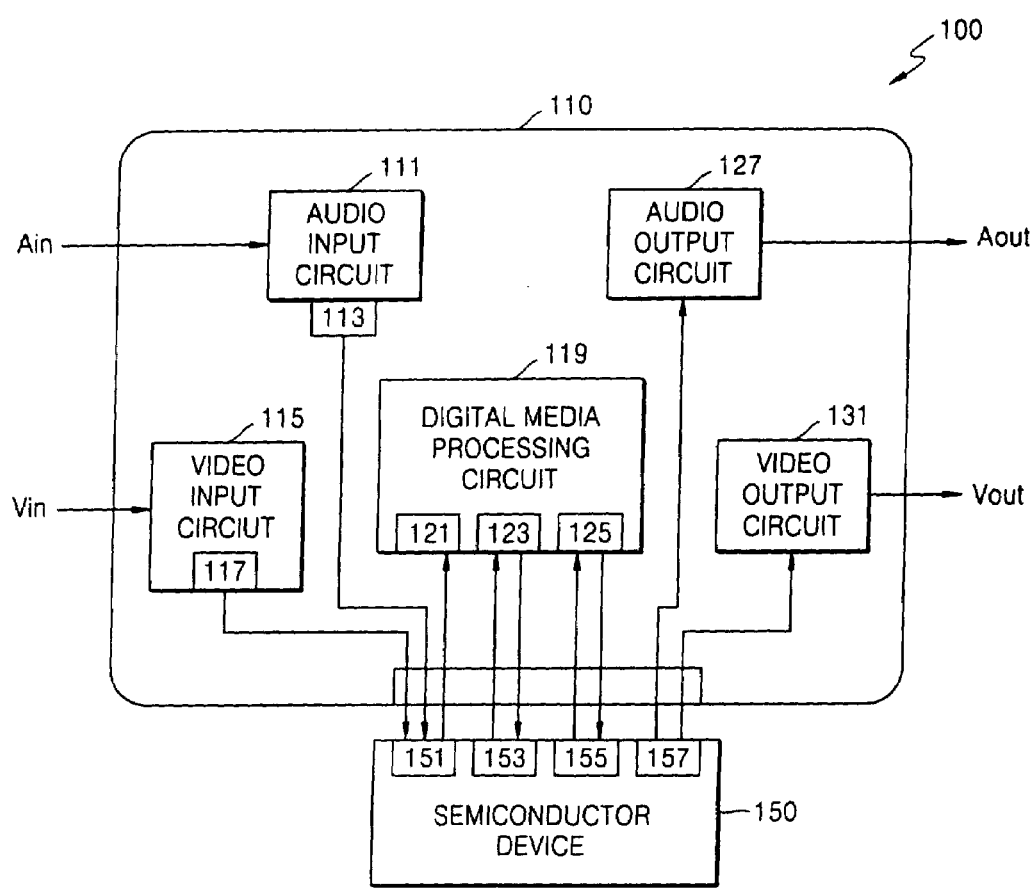
FIG. 1 illustrates a system including a conventional multi-port/multi-media semiconductor device.

The circuit block 210 includes an audio input circuit 211, a video input circuit 213, a digital media processing circuit 215, an audio output circuit 217, and a video output circuit 219. In an aspect of the present invention, such application circuits 211, 213, 215, 217, and 219 do not require additional chips (for example, the I/O interfaces 113 and 117 illustrated in FIG. 1) to interface with the semiconductor device 230.

Each of the audio input circuit 211, the video input circuit 213, and the digital media processing circuit 215 generates at least one respective signal. For an example embodiment of the present embodiment, it is assumed that each of the audio input circuit 211, the video input circuit 213, and the digital media processing circuit 215 generates respective differential signals INx/INBx (x is a different natural number for each of the application circuits 211, 213, and 215).

For example, the video input circuit 213 receives and processes a video signal Vin and outputs first differential input signals IN1/INB1 to a first input buffer 2401 of the semiconductor device 230. Similarly, the audio input circuit 211 receives and processes an audio signal Ain and outputs second differential input signals IN2/INB2 to a second input buffer 2402 of the semiconductor device 230.

In the example of FIG. 2, the digital media processing circuit 215 generates a plurality of pairs of differential input signals including third differential input signals IN3/INB3 through $m^{th}$ differential input signals INm/INBm, with m being a natural number. The digital media processing circuit 215 transmits each of the third differential input signals IN3/INB3 through the $m^{th}$ differential input signals INm/INBm to a respective one of the third through $m^{th}$, 2403, . . . , and 240m input buffers of the semiconductor device 230. Other signals to be processed by the digital media processing circuit 215 may be input to the digital media processing circuit 215.

In this manner, each of the differential input signals, IN1/INB1, IN2/INB2, IN3/INB3, . . . and INm/INBm is transmitted to a respective one of the inputs buffers 2401, 2402, 2403, . . . and 240m. As shown by example in Table 1, the first through $m^{th}$ differential input signals, IN1/INB1, IN2/INB2, IN3/INB3, . . . and INm/INBm, are each of a respective signal type having a respective reference level and respective swing width.

TABLE 1

| Input Signals | DC Reference Level (V) | Swing Width based on DC Level |
|---|---|---|
| IN1/INB1 | 1.65 V | ±150 mV |
| IN2/INB2 | 1.40 V | ±400 mV |
| IN3/INB3 | 0.90 V | ±600 mV |
| INm/INBm | 0.15 V | ±150 mV |

For example according to Table 1, the first differential input signals IN1/INB1 swing between 1.50V and 1.80V, and the $m^{th}$ differential input signals INm/INBm swing between 0V and 0.30V.

The semiconductor device 230 in FIG. 2 includes first through $m^{th}$ input buffers 2401 through 240m and an output buffer 2. Circuits unnecessary for describing the technical features of the present invention are not shown in the drawings.

Each of the input buffers 2401, 2402, 2403, . . . , and 240m receives a respective one of the differential input signals IN1/INB1, IN2/INB2, IN3/INB3, . . . and INm/INBm to generate a respective output signal of a predetermined signal type, such as the signal type with a CMOS swing. In addition, each of the input buffers 2401, 2402, 2403, . . ., and 240m receives respective program control signals. Such program control signals are programmed into each of the input buffers 2401, 2402, 2403, . . ., and 240m as will be further described herein.

Each of the input buffers 2401, 2402, 2403, . . . and 240m includes: a respective one of mode program circuits 3001, 3002, 3003, . . ., and 300m; a respective one of mode control circuits 4001, 4002, 4003, . . ., and 400m, and a respective one of receivers 5001, 5002, 5003, . . ., and 500m, as illustrated in FIG. 2.

Each of the mode program circuits 3001, 3002, 3003, . . ., and 300m receives a respective mode program signal indicating a respective signal type of respective input signals input to the respective one of the receivers 5001, 5002, 5003, . . ., and 500m. The respective mode program signal indicates the respective DC reference level and the respective swing width for the respective signal type of such respective input signals. Each of the mode program circuits 3001, 3002, 3003, . . ., and 300m generates respective second control signals REG<0:n−1> and REG<n:2n−1> from the respective mode program signals for the respective one of the input buffers 2401, 2402, 2403, . . . and 240m.

Figure 7:
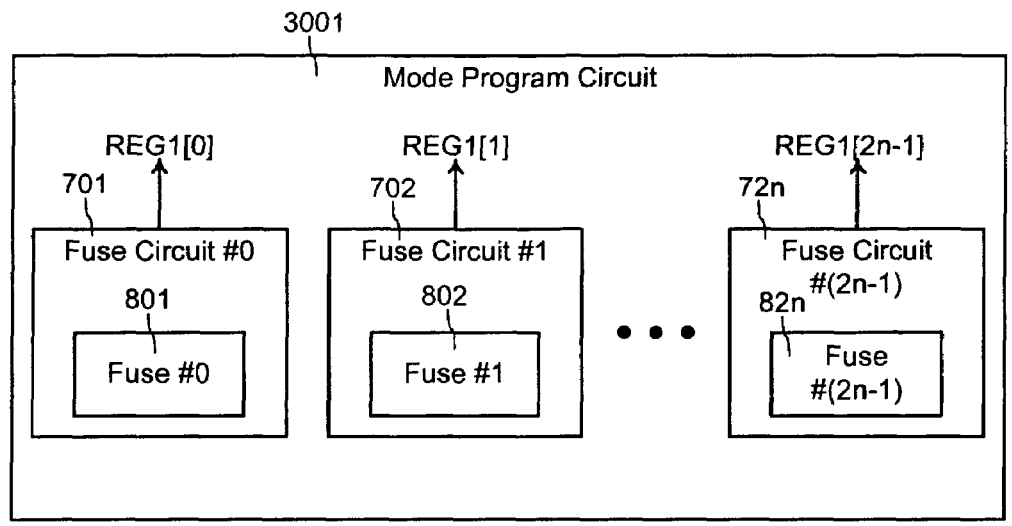
FIG. 7 is a block diagram of a program circuit in FIG. 2, using fuses according to an embodiment of the present invention.

In one embodiment of the present invention, the respective mode program signals are programmed into each of the input buffers 2401, 2402, 2403, . . . and 240m. Referring to a block diagram in FIG. 7 for example, the first mode program circuit 3001 includes a set of 2n fuse circuits 701, 702, . . . , and 72n that generates bits REG1[0], REG1[2], . . . , and REG1[2n−1] of the second control signals. Each one of the fuse circuits 701, 702, . . . , and 72n includes a respective fuse, 801, 802, . . . , and 82n that is cut or not cut for dictating the logic level of the respective one of the control signal bits REG1[0], REG1[2], . . . , and REG1[2n−1].

Implementation of such fuse circuits are individually known to one of ordinary skill in the art of electronics. In this manner, the respective mode program signals are programmed into the fuses 801, 802, . . . , and 82n that are each cut or not cut for indicating the signal type of the respective input signals corresponding to the mode program circuit 3001. Similarly, each of the other mode program circuits 3002, 3003, . . . , and 300m also includes similar respective fuse circuits with fuses that are each cut or not cut for indicating the signal type of the respective input signals corresponding to each of the mode program circuits 3002, 3003, . . . , and 300m.

Figure 8:
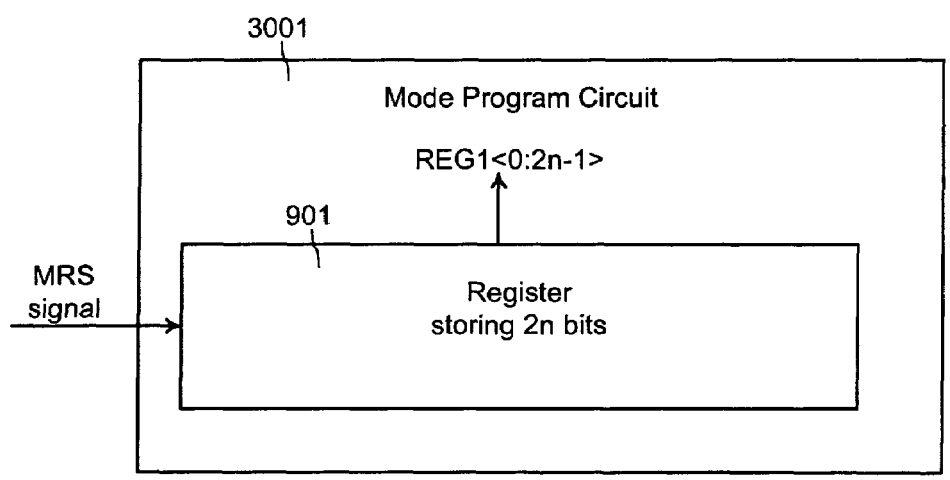
FIG. 8 is a block diagram of a program circuit in FIG. 2, using a register according to another embodiment of the present invention.

Alternatively, referring to a block diagram in FIG. 8 for example, the first mode program circuit 3001 includes a register 901 for generating and storing the 2n bits of the second control signals REG1<0:2n−1> after such 2n bits are indicated from a MRS (mode register set) signal. The MRS signal may be provided by an external device such as a host system for example. Similarly, each of the other mode program circuits 3002, 3003, . . . , and 300m also includes a similar respective register for generating and storing the respective second control signals from a respective MRS signal.

Each of the mode control circuits 4001, 4002, 4003, . . . , and 400m generates respective first control signals Vppb<0:n−1>, Vnnb<0:n−1>, Vpb, and Vnb in response to the respective second control signals REG<0:n−1> and REG<n:2n−1> within each input buffer. For example, within each mode control circuit, the respective voltage of each of the respective first control signals Vppb<0:n−1>, Vnnb<0:n−1>, Vpb, and Vnb is determined by the respective second control signals REG<0:n−1> and REG<n:2n−1>.

Each of the receivers 5001, 5002, 5003, . . . , and 500m generates a respective output signal of the predetermined signal type from the respective differential input signals IN/INB and the respective second control signals REG<0:n−1> and REG<n:2n−1>. In one embodiment of the present invention, the predetermined signal type of the respective output signal for each of the receivers 5001, 5002, 5003, . . . , and 500m is of the CMOS swing type.

The signal type of CMOS swing is individually known to one of ordinary skill in the art of electronics. Such a signal type is suitable for processing by the semiconductor device 230. Thus, each of the receivers 5001, 5002, 5003, . . . , and 500m generates a respective output signal with CMOS swing regardless of the signal type of the respective differential input signals IN/INB.

The output buffer 2 outputs signals processed by the semiconductor device 230 to the audio output circuit 217 and the video output circuit 219. The audio output circuit 217 and the video output circuit 219 process the signals output from the output buffer 2 and generate an audio output signal Aout and a video output signal Vout, respectively.

Figure 3:
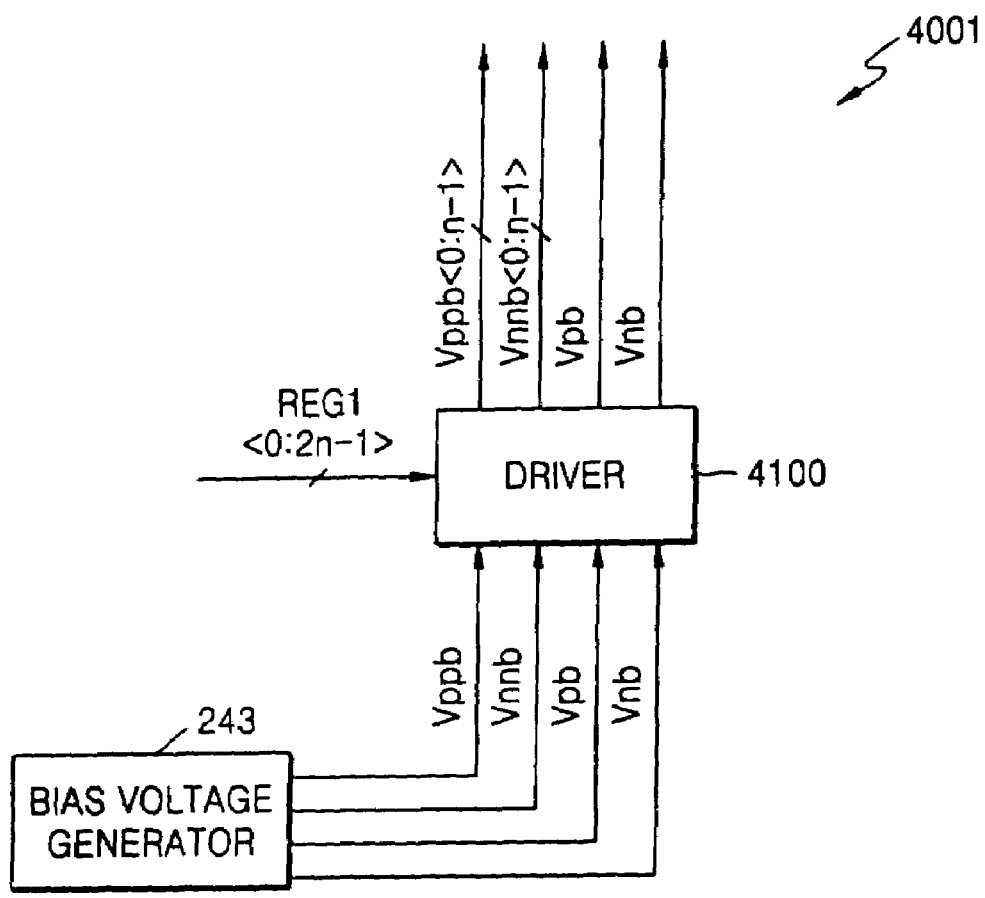
FIG. 3 is a block diagram of a mode control circuit in FIG. 2, according to an embodiment of the present invention.

FIG. 3 shows a block diagram of the first mode control circuit 4001 of FIG. 2. Each of the other mode control circuits 4002, 4003, . . . , and 400m is also implemented in a similar manner, in one embodiment of the present invention.

Referring to FIG. 3, the first mode control circuit 4001 includes a bias voltage generator 243 and a driver 4100. The bias voltage generator 243 generates a first bias voltage Vppb, a second bias voltage Vnnb, a third bias voltage Vpb, and a fourth bias voltage Vnb. Each of the bias voltages Vppb, Vnnb, Vpb, and Vnb may be different from eachother. For example, the first bias voltage Vppb is 1.2V, the second bias voltage is Vnnb is 0.5V, the third bias voltage Vpb is 1.0V, and the fourth bias voltage Vnb is 0.7V.

Figure 4:
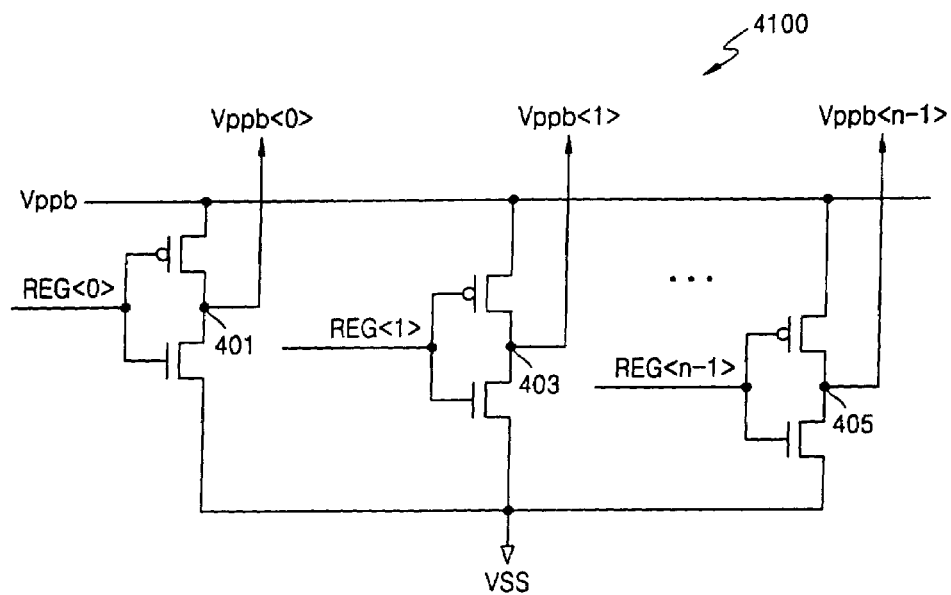
FIG. 4 is a circuit diagram of a driver in FIG. 3, according to an embodiment of the present invention.
Figure 4:
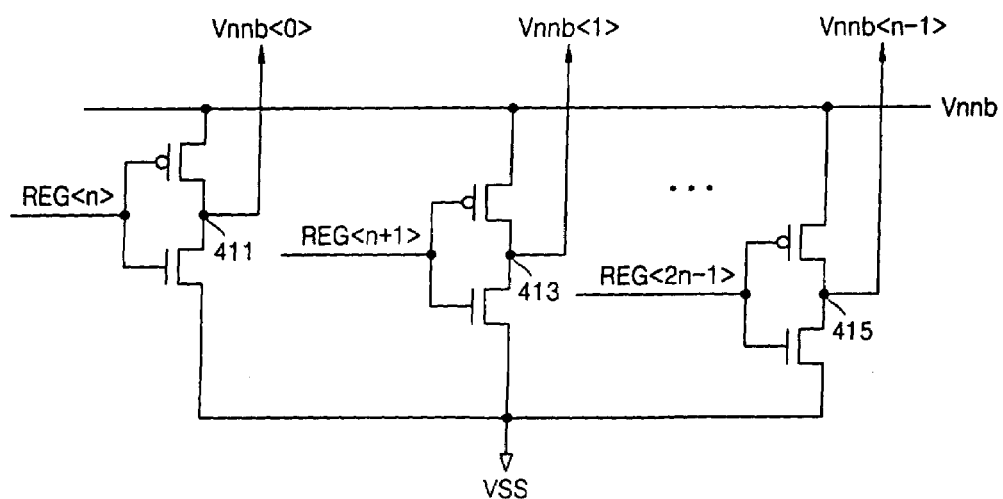

FIG. 4 shows an example implementation of the driver 4100 of FIG. 3 which includes a plurality of inverters, in an example embodiment of the present invention. The driver 4100 receives the first, second, third, and fourth bias voltages Vppb, Vnnb, Vpb, and Vnb from the bias voltage generator 243. In addition, the driver 4100 receives the second control signals REG1<0:2n−1> from the first mode program circuit 3001.

The driver 4100 then generates the first control signals Vppb<0:n−1>, Vnnb<0:n−1>, Vpb, and Vnb from the bias voltages Vppb, Vnnb, Vpb, and Vnb and the second control signals REG1<0:2n−1>. FIG. 4 illustrates generation of the first control signals Vppb<0:n−1> and Vnnb<0:n−1> at the output nodes 401, 403, . . . , 405, 411, 413, . . . , 415 of the plurality of inverters of FIG. 4. One inverter is used for generating one of the bits of Vppb<0:n−1> and Vnnb<0:n−1> in FIG. 4. The first control signals Vppb<0:n−1>, Vnnb<0:n−1>, Vpb, and Vnb are transmitted to input terminals of the first receiver 5001.

Each of the other mode control circuits 4002, 4003, . . . , and 400m may also be implemented in a similar manner to the first mode control circuit 4001 of FIGS. 3 and 4 to generate respective first control signals Vppb<0:n−1>, Vnnb<0:n−1>, Vpb, and Vnb from the bias voltages Vppb, Vnnb, Vpb, and Vnb and the respective second control signals REG<0:2n−1> for each of the input buffers 2401, 2402, 2403, . . . , and 240m.

Figure 5:
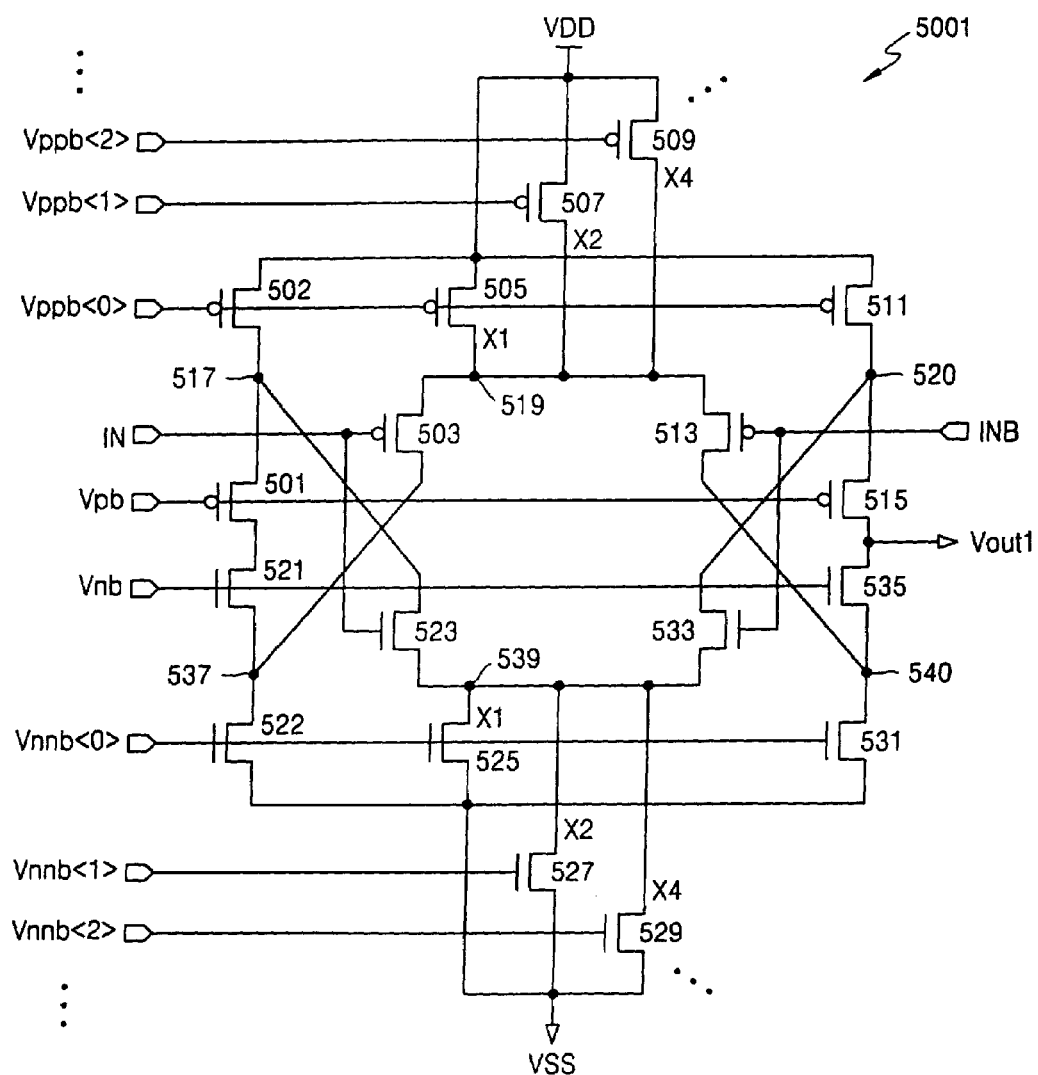
FIG. 5 is a circuit diagram of a receiver in FIG. 2, according to an embodiment of the present invention.

FIG. 5 is a circuit diagram of the first receiver 5001 of FIG. 2. Each of the other receivers 5002, 5003, . . . , and 500*m* is also implemented in a similar manner, in one embodiment of the present invention.

Referring to FIG. 5, PMOS transistors 505, 507, and 509 are connected between a voltage source VDD and a node 519. A PMOS transistor 502 is connected between the voltage source VDD and a node 517, and a PMOS transistor 511 is connected between the voltage source VDD and a node 520.

When a β ratio (i.e., a ratio of the channel length to the channel width) of the PMOS transistor 505 is 1 (X1), the β ratio of the PMOS transistor 507 is 2(X2), and the β ratio of the PMOS transistor 509 is 4(X2). Thus, the β ratios of the PMOS transistors 505, 507, and 509 increase geometrically in one embodiment of the present invention. However, the β ratio of each of the PMOS transistors 505, 507 and 509 is not limited thereto for purposes of the present invention.

One of the first control signals (Vppb<0>) is input to a gate of each of the PMOS transistors 502, 505, and 511. Another one of the first control signals (Vppb<1>) is input to a gate of the PMOS transistor 507. Another one of the first control signals (Vppb<2>) is input to a gate of the PMOS transistor 509.

A PMOS transistor 503 is connected between the node 519 and a node 537, and one of the differential input signals IN (IN1 for the first receiver 5001) is input to a gate of the PMOS transistor 503. An NMOS transistor 523 is connected between the node 517 and a node 539, and the same one of the differential input signal IN (IN1 for the first receiver 5001) is input to a gate of the NMOS transistor 523.

A PMOS transistor 513 is connected between the node 519 and a node 540, and the other of the differential input signals INB (INB1 for the first receiver 5001) is input to a gate of the PMOS transistor 513. An NMOS transistor 533 is connected between a node 520 and a node 539, and the same one of the differential input signals (INB1 for the first receiver 5001) is input to a gate of the NMOS transistor 533.

A PMOS transistor 501 and an NMOS transistor 521 are connected in series between the node 517 and the node 537. A PMOS transistor 515 and an NMOS transistor 535 are connected in series between the node 520 and a node 540.

One of the first control signals (Vpb) is input to each of the PMOS transistors 501 and 515, and another one of the first control signals (Vnb) is input to a gate of each of the NMOS transistors 521 and 535.

An NMOS transistor 522 is connected between the node 537 and a ground voltage source VSS, and an NMOS transistor 531 is connected between the node 540 and the ground voltage source VSS. Each of NMOS transistors 525, 527, and 529 is connected between the node 539 and the ground voltage source VSS.

One of the first control signals (Vnnb<0>) is input to a gate of each of the NMOS transistors 522, 525, and 531. Another one of the first control signals (Vnnb<1>) is input to a gate of the NMOS transistor 527, and another one of the first control signals (Vnnb<2>) is input to a gate of the NMOS transistor 529.

The respective output signal Vout1 for the first input buffer 2401 is generated at a node coupling the PMOS transistor 515 and the NMOS transistor 535. The output signal Vout1 swings between the voltages VDD and VSS, to generate the output signal Vout1 that is of the CMOS swing type in one embodiment of the present invention. However, the present invention may be practiced with any other voltages instead of VDD and/or VSS such that the output signal Vout1 is of any other predetermined signal type.

When the β ratio of the NMOS transistor 525 is 1 (X1), the β ratio of the NMOS transistor 527 is 2(X2), and the β ratio of the NMOS transistor 529 is 4(X2), in one embodiment of the present invention. Thus, the β ratios of the NMOS transistors 525, 527, and 529 increase geometrically in one embodiment of the present invention. However, the β ratio of each of the NMOS transistors 525, 527 and 529 is not limited thereto.

Each of the PMOS and NMOS transistors 505, 507, 509, 525, 527, and 529, is a current source in FIG. 5. A respective level of current flowing through each of the PMOS and NMOS transistors 505, 507, 509, 525, 527, and 529 is controlled by a respective one of the first control signals Vppb<0>, Vppb<1>, Vppb<2>, Vnnb<0>, Vnnb<1>, and Vnnb<2> coupled to the gate of such a transistor. By controlling the level of current that flows through each of the PMOS and NMOS transistors 505, 507, 509, 525, 527, and 529, a common-mode level of the first receiver 5001 is adjusted.

In this manner, the first control signals Vppb<0:n−1>, Vnnb<0:n−1>, Vpb, and Vnb indicate the signal type and thus a first common mode voltage of the differential input signals IN/INB to the receiver 5001. The receiver 5001 uses such first control signals Vppb<0:n−1>, Vnnb<0:n−1>, Vpb, and Vnb to generate the output signal Vout1 having a second common mode voltage of the CMOS swing type (or any other predetermined signal type) from the input signals IN/INB and such first control signals Vppb<0:n−1>, Vnnb<0:n−1>, Vpb, and Vnb.

Each of the other receivers 5002, 5003, . . . , and 500*m* may also be implemented in a similar manner as the first receiver 5001 of FIG. 5 to generate a respective output signal Vout from the respective input signals IN/INB and the respective first control signals Vppb<0:n−1>, Vnnb<0:n−1>, Vpb, and Vnb for each of the input buffers 2401, 2402, 2403, . . . , and 240*m*.

Figure 6:
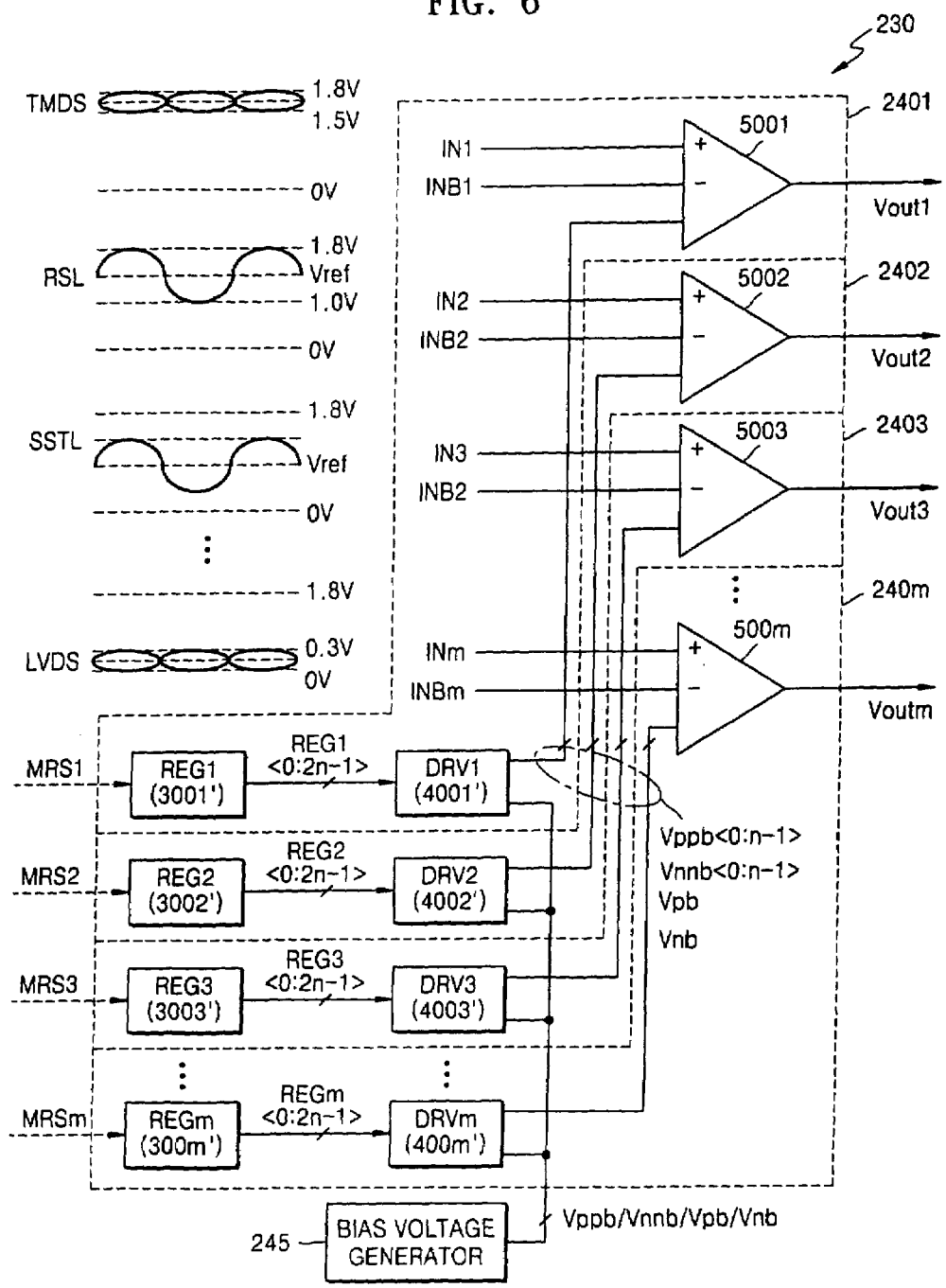
FIG. 6 is a block diagram of a multi-port/multi-media semiconductor device according to another embodiment of the present invention.

FIG. 6 is a block diagram of a multi-port/multi-media semiconductor device 230 according to another embodiment of the present invention. Referring to FIGS. 2 and 6, the multi-port/multi-media semiconductor device 230 includes first through m$^{th}$ input buffers 2401, 2402, 2403, . . . , and 240*m* and a bias voltage generator 245. The bias voltage generator 245 of FIG. 6 generates a plurality of bias voltages Vppb, Vnnb, Vpb, and Vnb that is shared among the first through m$^{th}$ input buffers 2401, 2402, 2403, . . . , and 240*m*.

Each of the input buffers 2401, 2402, 2403 . . . , and 240*m* includes: a respective one of registers 3001', 3002', 3003', . . . , and 300*m*'; a respective one of drivers 4001', 4002', 4003', . . . , and 400*m*'; and a respective one of receivers 5001, 5002, 5003, . . . , and 500*m*.

Each of the registers 3001', 3002', 3003', . . . , and 300*m*' receives a respective one of program control signals MRS1, MRS2, MRS3, . . . , and MRSm to generate a respective set of second control signals REG1<0:2n−1>, REG2<:2n−1>, REG3<0:2n−1>, . . . , and REGm<0:2n−1>. Each of the program control signals MRS1, MRS2, MRS3, . . . , and MRSm may be a MRS (mode register set) signal or a digital control signal.

Each of the drivers 4001', 4002', 4003', . . . , and 400*m*' is implemented similarly to the driver 4100 of FIG. 4, in one embodiment of the present invention. Each of the drivers 4001', 4002', 4003', . . . , and 400*m*' receives a respective set of second control signals REG<0:2n−1> and the bias voltages Vppb, Vnnb, Vpb, and Vnb from, the bias voltage generator 245. Using such signals, each of the drivers 4001', 4002', 4003', . . . , and 400*m*' generates a respective set of first control signals Vppb<0:n−1>, Vnnb<0:n−1>, Vpb, and Vnb for each of the input buffers 2401, 2402, 2403, . . . , and 240*m*.

Each of the receivers 5001, 5002, 5003, . . . , and 500*m* of FIG. 6 is implemented similarly to the receiver 5001 of FIG. 5, in one embodiment of the present invention. Thus, each of the receivers 5001, 5002, 5003, . . . , and 500*m* receives respective differential input signals IN/INB and a respective set of first control signals Vppb<0:n−1>, Vnnb<0:n−1>, Vpb, and Vnb that control the current sources within the receiver to generate a respective output signal Vout that is of the CMOS swing type (or any other predetermined signal type). As a result, each of the output signals Vout of the receivers 5001, 5002, 5003, . . . , and 500*m* is of the predetermined signal type (such as CMOS swing type) regardless of the signal type of the differential input signals to each of the input buffers 2401, 2402, 2403, . . . , and 240*m*.

Each of the output signals Vout1, Vout2, Vout3, . . . , and Voutm is input to a latch (not shown) synchronized with a system clock signal transmitted to the multi-port/multi-media semiconductor device 230.

Table 2 illustrates the logic state of the second control signals REG<0:5> when "n" is 3 in the expression "2n−1" for each of different signal types of the differential input signals IN/INB. Here, "L" denotes a logic low, and "H" denotes a logic high.

TABLE 2

| Signal Type | REG<0> | REG<1> | REG<2> | REG<3> | REG<4> | REG<5> |
|---|---|---|---|---|---|---|
| TMDS | L | L | L | L | H | H |
| RSL | L | H | L | L | L | H |
| SSTL | L | L | H | L | H | L |
| LVDS | L | H | H | L | L | L |

Referring to Tables 1 and 2, and FIGS. 2 through 5, assume for example that the first input signals IN1/INB1 are of the TMDS signal type with a DC reference level of 1.65 and with a swing width of ±150 mV. The manufacturer of the semiconductor device 230 determines such a signal type of the first input signals IN1/INB1 from the specifications.

In that case, the first mode program circuit 3001 is programmed based on such a DC reference level and swing width of the first input signals IN1/INB1. A program control signal for programming the first mode program circuit 3001 may be input from a source outside the semiconductor device 230. The MRS signal may be used as the program control signal. Alternatively, the first mode program circuit 3001 may be programmed by cutting or not cutting each of a plurality of fuses.

The first mode program circuit 3001 generates the second control signals REG<0:5> with logic states as indicated in Table 2 for the case when the input signals IN/INB are of the TMDS signal type. The driver 4100 generates the first control signals Vppb<0:2> and Vnnb<0:2> based on the logic states of the second control signals REG<0:5>.

The first mode program circuit 3001 or the first mode control circuit 4001 generates the bias voltages Vpb and Vnb and outputs the bias voltages Vpb and Vnb to the first receiver 5001, in one embodiment of the present invention. The first receiver 5001 receives the first input signals IN1/INB1 and the first control signals Vppb<0:2>, Vnnb<0:2>, Vpb, and Vnb and generates the first output signal Vout1 which swings between voltage levels VDD and VSS (i.e., for CMOS swing).

For another example, assume that the first input signals IN1/INB1 are of the RSL signal type with a DC reference level of 1.4 and with a swing width of ±400 mV. In that case, the first mode program circuit 3001 is programmed based on such a DC reference level and swing width of the first input signals IN1/INB1. Accordingly, the first mode program circuit generates the second control signals REG<0:5> indicating the signal type of the input signals IN1/INB1.

Thereafter, the first mode control circuit 4001 generates the first control signals Vppb<0:2>, Vppn<0:2>, Vpb, and Vnb in response to the second control signals REG<0:5> and transmits the first control signals Vppb<0:2>, Vppn<0:2>, Vpb, and Vnb to the first receiver 5001. The first receiver 5001 receives the first input signals IN1/INB1 and the first control signals Vppb<0:2>, Vppn<0:2>, Vpb, and Vnb to generate the first output signal Vout1 which also swings between voltage levels VDD and VSS (i.e., for CMOS swing).

Similarly, those of ordinary skill in the art would understand the operations of the first input buffer 2401 when the first input signals IN1/INB1 are of the SSTL signal type or the LVDS signal type.

Example operations of the first through $m^{th}$ input buffers 2401 through 240*m* will now be described with reference to Tables 1 and 2, and FIGS. 4 and 6. Assume for example that the first input signals IN1/INB1 are of the TMDS signal type, the second input signals IN2/INB2 are of the RSL signal type, the third input signals IN3/INB3 are of the SSTL signal type, and the $m^{th}$ input signals INm/INBm are of the LVDS signal type.

In that case, each of the registers 3001' through 300*m*' is programmed depending on the respective DC reference level and swing width of the respective signal type of the respective input signals IN/INB as indicated by a respective one of the program control signals MRS1 through MRSm. In addition, each of the registers 3001' through 300*m*' outputs a respective set of second control signals REG<0:2n−1> indicating the signal type of the respective input signals IN/INB.

Each of the drivers 4001' through 400*m*' receives the respective set of second control signals REG<0:2n−1> and the bias voltages Vppb, Vnnb, Vpb, and Vnb to generate a respective set of first control signals Vppb<0:n−1>, Vnnb<0:n−1>, Vpb, and Vnb. The respective set of first control signals Vppb<0:n−1>, Vnnb<0:n−1>, Vpb, and Vnb indicates the signal type and thus a first common mode voltage of the differential input signals IN/INB to each of the receivers 5001 through 500*m*. Each of the receivers 5001 through 500*m* uses such first control signals Vppb<0:n−1>, Vnnb<0:n−1>, Vpb, and Vnb to generate a respective output signal Vout of a predetermined signal type (such as the CMOS swing type) regardless of the signal type of the differential input signals IN/INB.

In this manner, each of the input buffers 2401, 2402, 2403, . . . , and 240*m* generates a respective output signal Vout of a predetermined signal type (such as the CMOS swing type) regardless of the signal type of the respective input signals IN/INB. Thus, referring to FIGS. 1 and 2, interface circuits of application circuits communicating with the semiconductor device 230 using the input buffers 2401, 2402, 2403, . . . , and 240*m* of the present invention are eliminated, thereby minimizing power consumption and layout area.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An input buffer comprising:
   a control circuit that generates first control signals depending on a signal type of at least one input signal; and
   a receiver that generates at least one output signal of a predetermined signal type from the at least one input signal and the first control signals;
   wherein the control circuit includes:
   a bias voltage generator that generates bias voltages; and
   a driver that generates the first control signals from the bias voltages and second control signals.

2. The input buffer of claim 1, further comprising:
   a program circuit for generating second control signals indicating the signal type of the at least one input signal, wherein the control circuit receives the second control signals to generate the first control signals from the second control signals.

3. The input buffer of claim 2, wherein the program circuit includes:
   a plurality of fuses, with each fuse being cut or not cut when programming the signal type of the at least one input signal into the program circuit.

4. The input buffer of claim 2, wherein the program circuit includes:
   at least one register for generating and storing the second control signals from a MRS (mode register set) signal when programming the signal type of the at least one input signal into the program circuit.

5. The input buffer of claim 1, wherein the signal type of the at least one input signal indicates a reference level and a swing width of the at least one input signal.

6. The input buffer of claim 1, wherein the receiver includes:
   a plurality of current sources, with each of the current sources being turned on or off depending on the first controls signals for generating the output signal of the predetermined signal type.

7. The input buffer of claim 1, wherein the predetermined signal type of the output signal is of a CMOS swing type.

8. The input buffer of claim 1, further comprising:
   a program circuit for generating the second control signals indicating the signal type of the at least one input signal.

9. A semiconductor device comprising:
   a plurality of input buffers, each input buffer receiving at least one respective input signal having a known respective input signal type from a respective external device, and each input buffer including:
   means for storing information regarding the known respective input signal type;
   a respective control circuit that generates respective first control signals depending on the known respective input signal type; and
   a respective receiver that generates at least one respective output signal of a predetermined signal type from the at least one respective input signal and the respective first control signals, with the respective output signal being further processed by the semiconductor device,
   wherein the respective first control signals are generated by the respective control circuits such that the predetermined signal type is same for all of the plurality of input buffers that receive respective input signals of at least two different respective known signal types.

10. The semiconductor device of claim 9,
    wherein the means for storing the information is a respective program circuit for generating respective second control signals indicating the respective signal type of the at least one respective input signal, wherein the respective control circuit receives the respective second control signals to generate the respective first control signals from the respective second control signals.

11. The semiconductor device of claim 10, wherein the respective program circuit includes:
    a plurality of fuses, with each fuse being cut or not cut when programming the respective signal type of the at least one respective input signal into the respective program circuit.

12. The semiconductor device of claim 10, wherein the respective program circuit includes:
    at least one register for generating and storing the respective second controls signals from a MRS (mode register set) signal when programming the respective signal type of the at least one respective input signal into the respective program circuit.

13. The semiconductor device of claim 9, wherein the respective signal type of the at least one respective input signal indicates a reference level and a swing width of the at least one respective input signal.

14. The semiconductor device of claim 9, wherein the respective receiver includes:
    a plurality of current sources, with each of the current sources being turned on or off depending on the respective first controls signals for generating the respective output signal of the predetermined signal type.

15. The semiconductor device of claim 9, wherein the predetermined signal type of each respective output signal is of a CMOS swing type.

16. A semiconductor device comprising:
    a plurality of input buffers, each input buffer including:
    a respective control circuit that generates respective first control signals depending on a respective signal type of at least one respective input signal; and
    a respective receiver that generates at least one respective output signal of a predetermined signal type from the at least one respective input signal and the respective first control signals,
    a bias voltage generator that generates bias voltages;
    and wherein the respective control circuit includes:
    a respective driver that generates the respective first control signals from the bias voltages and respective second control signals.

17. The semiconductor device of claim 16, wherein each input buffer further includes:
    a respective program circuit for generating the respective second control signals indicating the respective signal type of the at least one respective input signal.

18. The semiconductor device of claim 16, wherein the semiconductor device is a multi-port/multi-media semiconductor device with each input buffer interfacing to receive the at least one respective input signal from a respective application circuit.

* * * * *